United States Patent
Hu

(10) Patent No.: US 7,061,282 B2
(45) Date of Patent: Jun. 13, 2006

(54) DIFFERENTIAL SIGNAL PAIRS GENERATOR

(75) Inventor: Ting-Li Hu, Taichung (TW)

(73) Assignee: Integrated Technology Express Inc., Hsinchu (TW)

( * ) Notice: Subject to any disclaimer, the term of this patent is extended or adjusted under 35 U.S.C. 154(b) by 36 days.

(21) Appl. No.: 10/828,115

(22) Filed: Apr. 19, 2004

(65) Prior Publication Data

US 2005/0174149 A1 Aug. 11, 2005

(30) Foreign Application Priority Data

Feb. 5, 2004 (TW) ............................. 93102572 A

(51) Int. Cl.
*H03K 3/00* (2006.01)

(52) U.S. Cl. ........................................ 327/108; 327/67

(58) Field of Classification Search ........ 327/108–112, 327/65–67, 77, 85, 89, 333; 326/62, 80–83
See application file for complete search history.

(56) References Cited

U.S. PATENT DOCUMENTS

| | | | | | |
|---|---|---|---|---|---|
| 4,835,422 | A | * | 5/1989 | Dike et al. ..................... | 327/19 |
| 5,281,865 | A | * | 1/1994 | Yamashita et al. .......... | 327/208 |
| 6,819,146 | B1 | * | 11/2004 | Chung ......................... | 327/76 |
| 6,822,435 | B1 | * | 11/2004 | Nomura ................... | 324/158.1 |

* cited by examiner

*Primary Examiner*—Kenneth B. Wells
(74) *Attorney, Agent, or Firm*—J.C. Patents

(57) ABSTRACT

A device for generating a pair of true/complementary-phase logic signals is provided. The device comprises a single-end to true/complementary-phase signal conversion circuit, a first stage circuit and a differential amplifier. The conversion circuit receives a single-end signal and converting the single-end signal to a first pair of true/complementary-phase signals. The first stage circuit receives the first pair of true/complementary-phase signals and performing a feedback control to obtain a second pair of true/complementary-phase signals. The differential amplifier receives the second pair of true/complementary-phase signals and outputs a pair of differential signals. Therefore, the rising time/falling time of one of the pair of differential signals is synchronized with the falling time/rising time of the other of the pair of differential signals.

4 Claims, 3 Drawing Sheets

DIFFERENTIAL SIGNAL PAIRS GENERATOR

CROSS-REFERENCE TO RELATED APPLICATION

This application claims the priority benefit of Taiwan application serial no. 93102572, filed on Feb. 5, 2004.

BACKGROUND OF THE INVENTION

1. Field of the Invention

The invention generally relates to a device for generating a pair of true/complement-phase (T/C-phase) logic signals. More particularly, the present invention relates to a device for generating a pair of true/complement-phase (T/C-phase) logic signals with feedback control.

2. Description of Related Art

In recent years, since the processing speed of computer has been significantly enhanced, the data transmission interface and data processing method have to be developed to meet the requirement of the computer. Traditionally, when using the transistor-transistor logic (TTL) signal level for parallel transmission of data, cables with number of wires same as the number of bits of the bandwidth of the data signal are required. Hence, when all the voltage levels of the bits of the data signal are changed at the same time, a significant noise is generated. The noise may reduce the rate of data transmission drastically. In addition, the length of the cables is limited due to the decay of the data signals during the signal transmission. Therefore, the differential signal pairs for transmission data signal in series has been developed for achieving higher transmission rate and lower noise level.

In general, the serial data transmission process is performed by transmitting the bits of the data at the same clock period in series. Hence, the differential signal transmission process is performed by using a voltage pairs with 180° phase difference to transmit a signal, wherein the voltage difference between the voltage pairs represents the value of the signal being transmitted. The advantage of differential signal transmission is that the noise generated by the conventional TTL input signal is effectively reduced. Specially, since the signal is transmitted by using two wires to send the pair of the voltages, the two noises of each voltage transmitted by the two wires are similar at the same time. Therefore, the two noises are generally called as the common mode transmission noise, and almost all the noises of the signal will be eliminated by the subtraction of the voltage pairs. Hence, when the signal is detected by measuring the difference between the voltage pairs, the common mode transmission noise will be eliminated. Therefore, in the serial differential signal transmission, only a pair of low-level voltages with 180° phase difference is required. However, in the traditional TTL signal transmission, a high-level voltage signal is required to prevent the signal from attenuation.

FIG. 1 is a waveform diagram schematically illustrating an excellent differential signal. Generally, the low-level differential signal include a pair of signals D+ and D−. The voltage levels of the pair of signals V(D+) and V(D−) can be obtained from the common mode voltage VCM±the differential voltage VDIFF. In addition, for example, a logic signal 1 is defined as V(D+)−V(D−)>0, and a logic signal 0 is defined as V(D+)−V(D−)<0.

FIG. 2 is a diagram schematically illustrating a conventional single-end true/complete (T/C)-phase logic signal converter. This signal converter 200 includes inverters 202, 204, and 206, and a differential amplifier 208. The signal converter 200 receives a single-end logic signal S. Thereafter, the single-end logic signal S is converted by the inverters 202 and 204 to generate a logic signal O+, and converted by the inverter 206 to generate a logic signal O−. Hence, the phase difference between the two logic signals O+ and O− is 180°, and thus a T/C-phase logic signal pair is constructed by the two logic signals O+ and O−. Then, the two logic signals O+ and O− are entered into the input terminals of the differential amplifier 208. Then, the differential amplifier 208 will output the low-level differential signals D+ and D− directly corresponding to the logic signals O+ and O−. However, since the signal O+ is generated via two inverters and the signal O− is only generated via one inverter, the waveform of the differential signals D+ and D− are not symmetrical in time axis. As shown in FIG. 3, the rising time TR and the falling time TF of the signal O+ fall behind the falling time TF and the rising time TR of the signal O−, thus the logic signals 1 and 0 that generated by subtracting the signals O+ and O− will alter. Therefore, the reliability of signal receiving and decoding is reduced. Further, the intersection of the signals D+ and the signals D− is defined as the common mode voltage VCM. As shown in FIG. 3, if the differential signals D+ and D− are not symmetrical, the common mode voltage VCM cannot be fixed at a certain voltage level. In general, the intersections of signals D+ and D− are easily affected by the length of the wire and the load connected the amplifier. In addition, since the conventional T/C-phase logic signal converter does not have a feedback loop, the converter is easily affected by the variation of process and the operation condition. Therefore, a device and a method for generating a precise T/C-phase logic signal pair is necessary.

SUMMARY OF THE INVENTION

The present invention is directed to a device and a method of generating a pair of T/C-phase logic signals to provide a precise differential signals. Accordingly, the influence of the variation of process and operation condition is eliminated and the bit error rate at the receiver end is reduced.

In addition, the present invention is directed to a device and a method of generating a pair of T/C-phase logic signals to provide a precise differential signals and amplify the differential signals. Accordingly, the influence of the variation from wiring for data transmission and load is eliminated and the bit error rate at the receiver end is reduced. Thus, the device and method of the present invention may be provided for a long-distance, low bit error rate data transmission.

The device for generating a pair of true/complementary-phase logic signals comprises, for example but not limited to, a single-end to true/complementary-phase signal conversion circuit, a first stage circuit, and a differential amplifier. The single-end to true/complementary-phase signal conversion circuit is adapted for receiving a single-end signal and converting the single-end signal to a first pair of true/complementary-phase signals. The first stage circuit is adapted for receiving the first pair of true/complementary-phase signals and performing a feedback control to obtain a second pair of true/complementary-phase signals. The differential amplifier is adapted for receiving the second pair of true/complementary-phase signals and outputting a pair of differential signals. Accordingly, the rising time/falling time of one of the pair of differential signals is synchronized with the falling time/rising time of the other of the pair of differential signals.

In one embodiment of the invention, the first stage circuit comprises two N-type transistors and two P-type transistors. Each of the two N-type transistors has a gate, a source, and a drain, wherein the gate of each of the two N-type transistors is connected to one of the pair of differential signals respectively, and the source of each of the two N-type transistors is connected to a ground. Each of the two P-type transistors has a gate, a source, and a drain, wherein the gate of each of the two P-type transistors is connected to the drain of each of the two N-type transistors respectively. The source of each of the two P-type transistors is connected to a high voltage level. The drain of each of the two P-type transistors is connected to the gate of the other of the two P-type transistors respectively, and is provided as two output terminals of the second pair of true/complementary-phase signals.

In one embodiment of the invention, the single-end to true/complementary-phase signal conversion circuit comprises a single-end input terminal, two inverters connected in series and an inverter. The single-end input terminal is adapted for receiving the single-end signal. The two inverters connected in series receives the single-end signal from the single-end input terminal and converting the single-end signal to a first signal of the first pair of true/complementary-phase signals. The input of the inverter is connected to the single-end input terminal for converting the single-end signal to a second signal of the first pair of true/complementary-phase signals.

In addition, the present invention provides a device for generating a pair of true/complementary-phase logic signals. The device comprises, for example but not limited to, a single-end to true/complementary-phase signal conversion circuit, a first stage circuit, a second stage circuit, and a differential amplifier. The single-end to true/complementary-phase signal conversion circuit is adapted for receiving a single-end signal and converting the single-end signal to a first pair of true/complementary-phase signals. The first stage circuit is adapted for receiving the first pair of true/complementary-phase signals and performing a first feedback control to obtain a second pair of true/complementary-phase signals. The second stage circuit is adapted for receiving the second pair of true/complementary-phase signals and performing an amplification operation and a second feedback control to obtain a third pair of true/complementary-phase signals. The differential amplifier is adapted for receiving the third pair of true/complementary-phase signals and outputting a pair of differential signals. Accordingly, the rising time/falling time of one of the pair of differential signals is synchronized with the falling time/rising time of the other of the pair of differential signals.

In one embodiment of the invention, the second stage circuit comprises, for example but not limited to, a first set of two inverters, a second set of two inverters and a pair of inverters. Wherein a first signal input terminal and a second signal input terminal are connected to each of the second pair of true/complementary-phase signals respectively. The first set of two inverters connected in series is connected to the first signal input terminal. The second set of two inverters connected in series is connected to the second signal input terminal. The pair of inverters includes a first inverter and a second inverter, wherein an input of the first inverter is connected to an output of the second inverter and connected between the two inverters of the first set of two inverters. In addition, an output of the first inverter is connected to an input of the second inverter and connected between the two inverters of the second set of the two inverters.

In one embodiment of the invention, the first stage circuit comprises two N-type transistors and two P-type transistors. Each of the two N-type transistors has a gate, a source, and a drain, wherein the gate of each of the two N-type transistors is connected to one of the pair of differential signals respectively, and the source of each of the two N-type transistors is connected to a ground. Each of the two P-type transistors has a gate, a source, and a drain, wherein the gate of each of the two P-type transistors is connected to the drain of each of the two N-type transistors respectively. The source of each of the two P-type transistors is connected to a high voltage level. The drain of each of the two P-type transistors is connected to the gate of the other of the two P-type transistors respectively, and is provided as two output terminals of the second pair of true/complementary-phase signals.

In one embodiment of the invention, the single-end to true/complementary-phase signal conversion circuit comprises a single-end input terminal, two inverters connected in series and an inverter. The single-end input terminal is adapted for receiving the single-end signal. The two inverters connected in series receives the single-end signal from the single-end input terminal and converting the single-end signal to a first signal of the first pair of true/complementary-phase signals. The input of the inverter is connected to the single-end input terminal for converting the single-end signal to a second signal of the first pair of true/complementary-phase signals.

Accordingly, since the device for generating a T/C-phase logic signal pair of the present invention provides a first stage circuit as a feedback control device, the different signals outputted are synchronized. Therefore, the voltage level of the common mode voltage VCM of the signals X+ and X− is fixed and the waveforms of the output different signals are symmetrical. In addition, the variance due to the process or the operation condition may be eliminated. In the present invention, when the wiring of the differential signal output layout is very long, a second stage circuit can be added to amplify the differential signal pair outputted by the first stage circuit. Hence, the waveforms of the different signals outputted may be symmetrical and synchronized. Thus, the influence of the wiring and the load is eliminated. Therefore, the present invention may be provided for long distance transmission, wherein the bit error rate at the receiver may be drastically reduced. Therefore, the device for generating a T/C-phase logic signal pair of the present invention is suitable for high-speed, long distance data transmission.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 4:
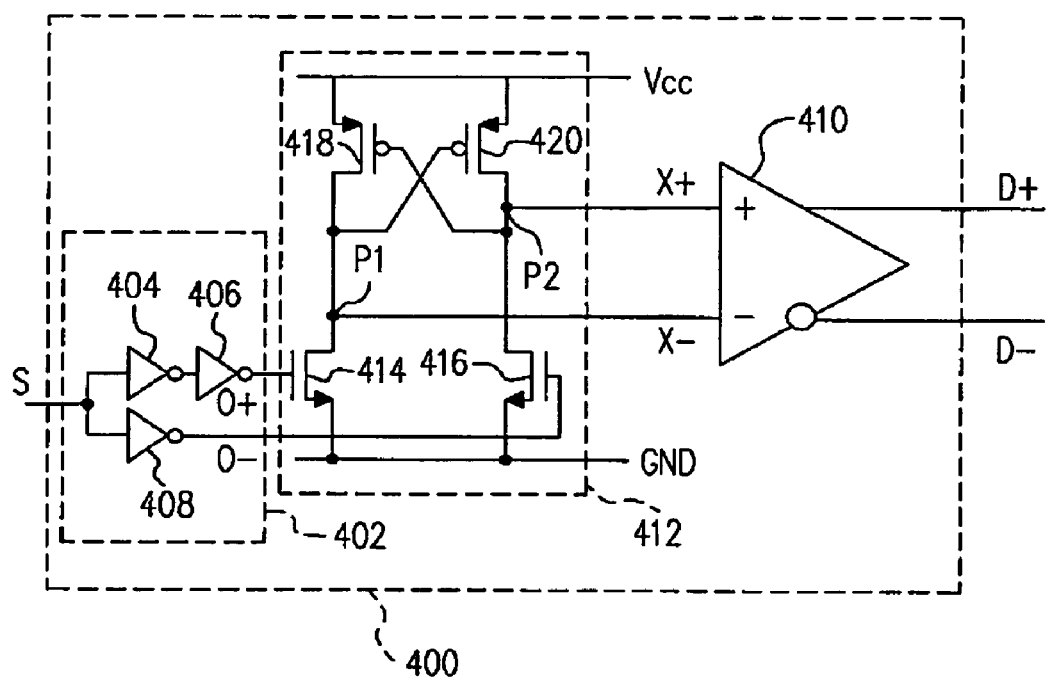
FIG. 4 is a circuit diagram of a device for generating a pair of T/C-phase logic signals in accordance with an embodiment of the present invention.

FIG. 4 is a circuit diagram of a device for generating a pair of T/C-phase logic signals in accordance with an embodiment of the present invention. Referring to FIG. 4, the device for generating a pair of T/C-phase logic signals 400 includes, for example but not limited to, a single-end to T/C-phase signal circuit 402, a differential amplifier 410, and a first stage circuit 412. The single-end to T/C-phase signal circuit 402 includes, for example but not limited to, inverters 404, 406, and 408. The first stage circuit 412 is a feedback circuit comprising N-type transistors 414 and 416, and P-type transistors 418 and 420. The input terminals O+ and O− of the first circuit 412 are respectively connected to the gates of N-type transistors 414 and 416 respectively. The sources of the N-type transistors 414 and 416 are connected to the ground. The drains of N-type transistors 414 and 416 are connected to the gates of P-type transistors 420 and 418 and to the drains of the P-type transistors 418 and 420 respectively. The sources of P-type transistors 418 and 420 are connected to a high voltage level Vcc.

Figure 1:
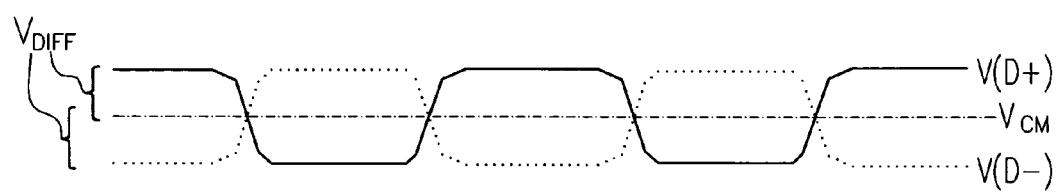
FIG. 1 is a waveform diagram schematically illustrating an excellent differential signal.
Figure 2:
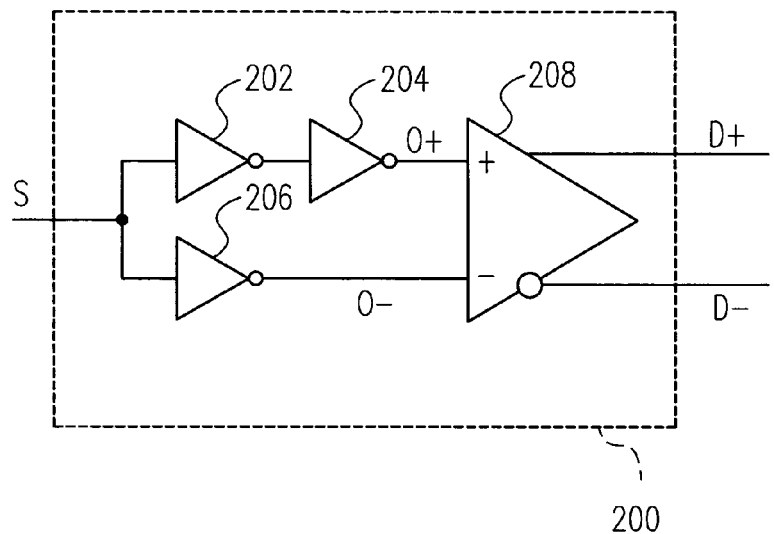
FIG. 2 is a conventional single-end T/C-phase logic signal converter.
Figure 3:
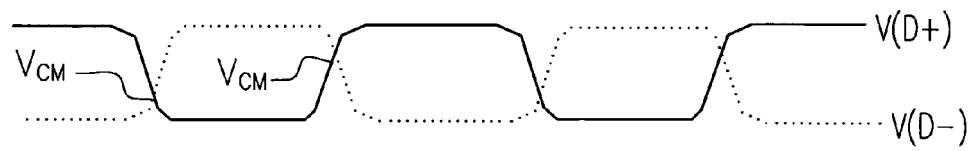
FIG. 3 shows the differential signals generated by the single-end T/C-phase logic signal converter of FIG. 2.

When a single logic signal S enters into the device 400, the single logic signal S passes through the inverters 404, 406, and 408 and becomes a pair of T/C-phase signals O+ and O−. In general, the raising time TR and falling time TF of signals O+ and the falling time TF and the rising time TR of signal O− cannot be identical respectively. In addition, the voltage of the cross-point of these two signals O+ and O− cannot be fixed. Moreover, the waveforms of these two signals are not symmetrical. For example, when the signal O+ is at a high voltage level and the signal O− is at a low voltage level, after the signal O+ enters into the N-type transistor 414, the N-type transistor 414 will be turned on so that the voltage level at point P1 is grounded. Hence, the point P1 will output a signal X− with a low voltage level. On the contrary, after signal O− enters into the N-type transistor 416, the N-type transistor 416 will not be turned on, but the low voltage level at point P1 will turn on the P-type transistor 420 so that the voltage level at point P2 is at a high voltage level. Hence, the point P2 will output a signal X+ with a high voltage level. Therefore, a pair of signals X+ (at high voltage level) and X− (at low voltage level) will be obtained. The time delay between the rising time TR/falling time TF of the signal X+ and the falling time TF/rising time TR of the signal X− is dependent on the time for turning on the P-type transistor 420. Since the time for turning on the P-type transistor 420 is very short, the rising time TR/falling time TF of the signal X+ and the falling time TF/rising time TR of the signal X− are almost the same. Therefore, the voltage level of the cross-point of the signals X+ and X−, i.e., the common mode voltage VCM can be fixed, and the waveforms of the signals X+ and X− are symmetrical. It is noted that, even the signals X+ and X− would be affected by the variance of layout, load, process, or operation condition, after the feedback control of the first stage circuit 412, the signals X+ and X− would still be symmetrical. Finally, the signals X+ and X− will be converted to the differential signals D+ and D− via the differential amplifier 410. The waveforms of the differential signals D+ and D− are similar to the waveforms shown in FIG. 1. In one embodiment of the present invention, the differential signals D+ and D− can be low-level differential signals D+ and D−. The voltage magnitude ranges from −5V to 5V.

Alternatively, when the signal O+ is at a low voltage level and the signal O− is at a high voltage level, after the signal O− enters into the N-type transistor 416, the N-type transistor 416 will be turned on so that the voltage level at point P2 is grounded. Hence, the point P2 will output a signal X+ with a low voltage level. On the contrary, after signal O+ enters into the N-type transistor 414, the N-type transistor 414 will not be turned on, but the low voltage level at point P2 will turn on the P-type transistor 418 so that the voltage level at point P1 is at a high voltage level. Hence, the point P1 will output a signal X− with a high voltage level. Therefore, a pair of signals X+ (at low voltage level) and X− (at high voltage level) will be obtained. The time delay between the rising time TR/falling time TF of signal X+ and falling time TF/rising time TR of the signal X− is dependent on the time for turning on the P-type transistor 418. Since the time for turning on P-type transistor 418 is very short, the rising time TR/falling time TF of the signal X+ and falling time TF/rising time TR of the signal X− are almost the same. Therefore, the voltage level of the cross-point of the signals X+ and X−, i.e., the common mode voltage VCM can be fixed, and the waveforms of the signals X+ and X− are symmetrical.

Figure 5:
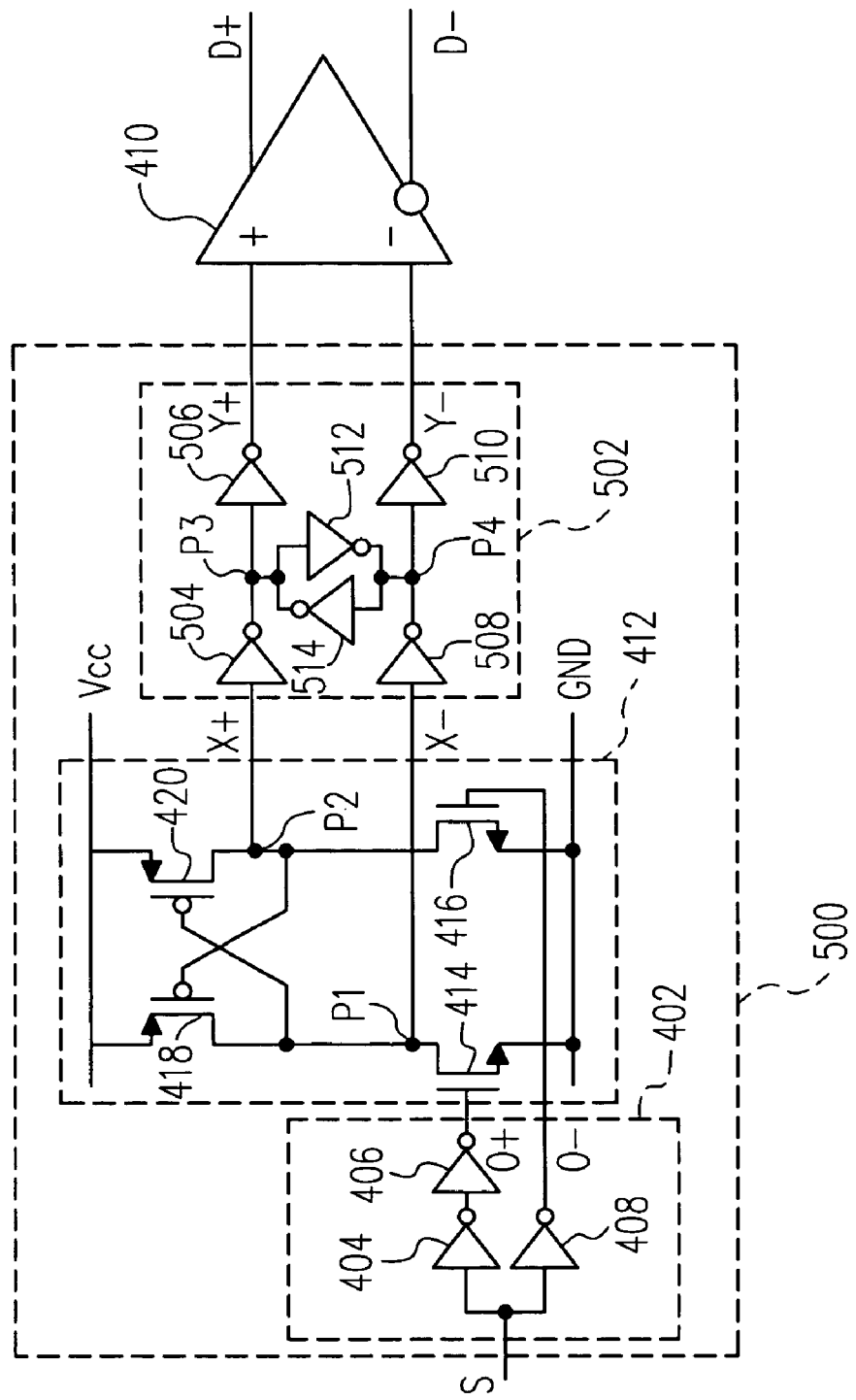
FIG. 5 is a circuit diagram of a device for generating a pair of T/C-phase logic signals in accordance with another embodiment of the present invention.

FIG. 5 is a circuit diagram of a device for generating a pair of T/C-phase logic signals in accordance with another embodiment of the present invention. Referring to FIG. 5, the device for generating a pair of T/C-phase logic signals 500 includes a single-end to T/C-phase signal circuit 402, a differential amplifier 410, a first stage circuit 412, and a second stage circuit 502. The first stage circuit 412 in FIG. 5 is the same as the first stage circuit 412 in FIG. 4, and is a feedback circuit comprising N-type transistors 414 and 416, and P-type transistors 418 and 420. The second stage circuit 502 includes inverters 504, 506, 508, 510 and a pair of inverters 512 and 514. The input terminal of the inverter 512 and the output terminal of the inverter 514 are connected at point P3. Point P3 is connected to the signal X+ via the inverter 504. The input terminal of the inverter 514 and the output terminal of the inverter 512 are connected at point P4. Point P4 is connected to the signal X− via the inverter 508. In an embodiment of the present invention, the inverters 504, 506, 508, and 510 may amplify the signals X+ and X−. For example, when the signals X+ and X− enter into the second stage circuit 502, the signals X+ and X− are amplified and inverted by the inverters 504 and 508 respectively. After the feedback control via the inverters 512 and 514, the rising time TR/falling time TF of the signal X+ and the falling time TF/rising time TR of the signal X− may be synchronized. Thereafter, the two signals are amplified and inverted by the inverters 506 and 510 respectively and become the signals Y+ and Y−. Finally, the signals Y+ and Y− will be converted to the differential signals D+ and D− via the differential amplifier 410. The waveforms of the differential signals D+ and D− are similar to the waveforms shown in FIG. 1. By adding the second stage circuit 502 between the first stage circuit and the differential amplifier 410, the rising time TR/falling time TF of the signal D+ and the falling time TF/rising time TR of the signal D− are synchronized. Therefore, the voltage level of the cross-point of the signals X+ and X−, i.e., the common mode voltage VCM can be fixed. In addition, the waveforms of the signals X+ and X− are amplified and symmetrical. Hence, when the wiring for transmitting the output signals X+ and X− is very long, the second stage circuit 502 can synchronize the differential signals X+ and X−. Therefore, the differential signals D+ and D− can be corrected detected by the receiver.

Accordingly, since the device for generating a T/C-phase logic signal pair of the present invention provides a first stage circuit as a feedback control device, the different signals outputted are synchronized. Therefore, the voltage level of the common mode voltage VCM of the signals X+ and X− is fixed and the waveforms of the output different signals are symmetrical. In addition, the variance due to the process or the operation condition may be eliminated. In the present invention, when the wiring of the differential signal output layout is very long, a second stage circuit can be added to amplify the differential signal pair outputted by the first stage circuit. Hence, the waveforms of the different signals outputted may be symmetrical and synchronized. Thus, the influence of the wiring and the load is eliminated. Therefore, the present invention may be provided for long distance transmission, wherein the bit error rate at the receiver may be drastically reduced. Therefore, the device for generating a T/C-phase logic signal pair of the present invention is suitable for high-speed, long distance data transmission.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A device, for generating a pair of true/complementary-phase logic signals, comprising: a single-end to true/complementary-phase signal conversion circuit, for receiving a single-end signal and converting the single-end signal to a first pair of true/complementary-phase signals; a first stage circuit, for receiving the first pair of true/complementary-phase signals and performing a first feedback control to obtain a second pair of true/complementary-phase signals; a second stage circuit, for receiving the second pair of true/complementary-phase signals and performing an amplification operation and a second feedback control to obtain a third pair of true/complementary-phase signals; and a differential amplifier, for receiving the third pair of true/complementary-phase signals and outputting a pair of differential signals; wherein a rising time/a falling time of one of the pair of differential signals is synchronized with a falling time/a rising time of the other of the pair of differential signals.

2. The device of claim 1, wherein the second stage circuit comprises: a first signal input terminal and a second signal input terminal connected to each of the second pair of true/complementary-phase signals respectively; a first set of two inverters connected in series, connected to the first signal input terminal; a second set of two inverters connected in series, connected to the second signal input terminal; a pair of inverters including a first inverter and a second inverter, wherein the an input of the first inverter is connected to an output of the second inverter and connected between the two inverters of the first set of two inverters, wherein an output of the first inverter is connected to an input of the second inverter and connected to between the two inverters of the second set of the two inverters.

3. The device of claim 1, wherein the first stage circuit comprises: two N-type transistors, wherein each of the two N-type transistors having a gate, a source, and a drain, wherein the gate of each of the two N-type transistors is connected to one of the pair of differential signals respectively, and the source of each of the two N-type transistors is connected to a ground; and two P-type transistors, wherein each of the two P-type transistors having a gate, a source, and a drain, wherein the gate of each of the two P-type transistors is connected to the drain of each of the two N-type transistors respectively, the source of each of the two P-type transistors is connected to a high voltage level, and the drain of each of the two P-type transistors is connected to the gate of the other of the two P-type transistors respectively, and is provided as two output terminals of the second pair of true/complementary-phase signals.

4. The device of claim 1, wherein the single-end to true/complementary-phase signal conversion circuit comprises: a single-end input terminal, for receiving the single-end signal; two inverters connected in series, receiving the single-end signal from the single-end input tenninal and converting the single-end signal to a first signal of the first pair of true/complementary-phase signals; and an inverter, wherein an input of the inverter is connected to the single-end input terminal for converting the single-end signal to a second signal of the first pair of true/complementary-phase signals.

* * * * *